United States Patent [19]
Olenick et al.

[11] Patent Number: 5,274,912
[45] Date of Patent: Jan. 4, 1994

[54] METHOD OF MANUFACTURING A MULTILAYER CIRCUIT BOARD

[75] Inventors: John A. Olenick, Brockport, N.Y.; Robert C. Daigle, Sterling, Conn.

[73] Assignee: Rogers Corporation, Rogers, Conn.

[21] Appl. No.: 939,105

[22] Filed: Sep. 1, 1992

[51] Int. Cl.$^5$ .................................. H05K 3/36
[52] U.S. Cl. ........................... 29/830; 29/846; 29/852; 156/902; 174/262
[58] Field of Search ............. 29/830, 846, 852, 848; 174/262; 156/902

[56] References Cited

U.S. PATENT DOCUMENTS

| | | | |
|---|---|---|---|
| 3,835,531 | 9/1974 | Luttmer | 29/830 X |
| 3,953,924 | 5/1976 | Zachry et al. | 174/262 X |
| 4,075,757 | 2/1978 | Malm et al. | 156/902 X |
| 4,634,631 | 1/1987 | Gazit et al. | 428/421 |
| 4,647,508 | 3/1987 | Gazit et al. | 428/421 |
| 4,685,210 | 8/1987 | King et al. | |
| 4,788,766 | 12/1988 | Burger et al. | 29/830 |
| 4,818,728 | 4/1989 | Rai et al. | |
| 4,849,284 | 7/1989 | Arthur et al. | 428/325 |
| 4,868,350 | 9/1989 | Hoffarth et al. | |
| 4,874,721 | 10/1989 | Kimura et al. | |
| 4,902,606 | 2/1990 | Patraw | |
| 5,030,499 | 7/1991 | Shaheen et al. | |
| 5,046,238 | 9/1991 | Daigle et al. | 29/830 |

FOREIGN PATENT DOCUMENTS 63-274199 11/1988 Japan.
WO8700390 1/1987 PCT Int'l Appl.

*Primary Examiner*—Carl J. Arbes
*Attorney, Agent, or Firm*—Fishman, Dionne & Cantor

[57] ABSTRACT

Methods of fabricating multilayer circuits are presented. In accordance with the present invention, a plurality of circuit layers comprised of a dielectric substrate having a circuit formed thereon are stacked, one on top of the other. The dielectric substrate is composed of a polymeric material capable of undergoing fusion bonding such as a fluoropolymeric based substrate. The circuits each include a layer of a noble metal at, at least, selected exposed locations. Once stacked the circuits are subjected to lamination under heat and pressure to simultaneously fuse all of the substrate and diffuse conductive layers together to form an integral multilayer circuit having solid conductive interconnects.

13 Claims, 3 Drawing Sheets

METHOD OF MANUFACTURING A MULTILAYER CIRCUIT BOARD

BACKGROUND OF THE INVENTION

This invention relates generally to methods of manufacturing multilayer circuit board and multichip modules. More particularly, this invention relates to new and improved methods of manufacturing multilayer circuits wherein interconnections between circuit layers may be accomplished in a single fusion bonding lamination step utilizing a noble metal. In a preferred embodiment, this fusion bonding is accomplished without the need for intermediate bonding plys. Further, this process allows a full range of interconnection and design rules without the need for sequential fabrication, which can significantly reduce process cost by improving yield and decreasing cycle time.

Multilayer circuits are well known and comprise a plurality of stacked substrate/circuit trace assemblies with interconnections between selected locations on the spaced circuit traces. Conventional manufacturing techniques for multilayer circuits generally do not yield multiple levels of interconnect This limits the circuit density and the number of substrates. When multiple interconnect levels are required, step intensive sequential process techniques are usually utilized with reduced yields.

U.S. Pat. No. 4,788,766 attempts to overcome these problems. This prior patent discloses a method wherein a multilayer assembly is made up of a number of individual circuit boards and each board has a substrate on which a first conductive layer is formed on one surface while a second conductive layer is formed on the opposite surface. The substrate is a dielectric material which insulates the conductive layers. Via holes are formed through the first conductive layer, the substrate and the second conductive layer at various locations. An outer conductive material, such as copper, is applied over the first and second conductive layers and onto the side walls of the holes. A conductive bonding material is then deposited onto the outer conductive material in the areas around the holes. Once the individual boards have been fabricated, they are stacked in a predetermined order and orientation with a suitable low temperature dielectric bonding ply (meaning that the bonding ply has a lower softening temperature than the circuit substrate material) positioned between each pair of layers. The dielectric bonding ply requires registered apertures therethrough which correspond to areas where the conductive layer of one substrate is to make an electrically conductive connection with the conductive layer of an adjacent substrate. Thus, the dielectric bonding ply integrally bonds adjacent boards together while providing electrical isolation and/or electrical connections between conductive layers of different boards. The assembly of boards is then subjected to a cycle of heat and pressure to effect a bond between the various board layers.

While the method of U.S. Pat. No. 4,788,766 overcomes some of the problems in the prior art, this prior method has certain disadvantages including the requirement for a substrate which has a melting temperature above the melting temperature of the bonding ply. In other words, the prior patent necessitates the use of a low temperature bond ply which limits the thermal rating of the multi-layer circuit. In addition, this prior method necessitates registered apertures in the bonding ply (leading to alignment problems) and is limited to multilayer circuits having plated through holes.

U.S. Pat. No. 5,046,238 attempts to overcome these problems. This prior art patent discloses a method wherein a plurality of circuit layers comprised of a dielectric substrate having a circuit formed thereon are stacked, one on top of the other. The dielectric substrate is composed of a polymeric material capable of undergoing fusion bonding such as a fluoropolymeric based substrate. Fusible conductive bonding material (e.g., solder) is applied on selected exposed circuit traces (prior to the stacking step) whereupon the entire stacking is subjected to lamination under heat and pressure to simultaneously fuse all of the substrate and conductive layers together to form an integral multilayer circuit having solid conductive interconnects.

In the first embodiment of U.S. Pat. No. 5,046,238, the discrete circuit layers are each prepared by (1) forming traces and pads on a removable mandrel; (2) laminating a layer of dielectric to the circuit and mandrel; (3) forming an access opening at selected locations through the dielectric layer (using laser, plasma, ion etch or mechanical drilling techniques) to expose selected circuit locations; (4) forming conductive posts in the access openings to a level below the top of the access openings; and (5) providing a fusible conductive material in the access opening. Thereafter, a stack-up is made of a plurality of these discrete circuit layers so that the exposed fusible conductive material contacts selected locations on an adjacent circuit. This stack-up is then subjected to heat and pressure to simultaneously fuse both the several layers of dielectric substrate and fusible conductive material to provide a cohesive fused multilayer circuit board.

In the second embodiment of U.S. Pat. No. 5,046,238, at least one discrete circuit board is made using any suitable technique to define a fusible dielectric substrate having a circuit pattern thereon. Next, a layer of fusible dielectric material having openings through selected locations is placed on the circuit board so that selected locations on the circuit pattern are exposed. Thereafter, a plug of fusible conductive material (e.g., solder) is placed in the openings (using manual, mechanical or like techniques). Next, a second circuit board is stacked on the first board so that the plugs of fusible conductive material align with and contact selected locations on the circuit pattern of the second circuit board. This stack-up is then subjected to heat and pressure to simultaneously fuse both the layers of fusible dielectric and the fusible conductive material to provide a cohesive fused multilayer circuit board.

While the method of U.S. Pat. No. 5,046,238 overcomes some of the problems in the prior art, this prior art method has certain disadvantages including problems commonly encountered with spreading of the solder mass during lamination, and evolution of the flux medium necessary to deoxidize the solder. Further, spreading of the solder mass is dependent on the low viscosity of the solder, the amount of solder and the proximity of other circuit features. Also, it is difficult to evolve all of the flux compound from the internal layers of the printed circuit board thereby presenting a potential long-term reliability problem from residual organics. With continued microminiaturization of circuit features, it was desired to produce circuit boards with feature sizes smaller than that possible using solder.

SUMMARY OF THE INVENTION

The above-discussed and other problems and deficiencies of the prior art are overcome or alleviated by the methods of fabricating multilayer circuits of the present invention. In accordance with the present invention, a plurality of circuit layers comprised of a dielectric substrate having a circuit formed thereon are stacked, one on top of the other. The dielectric substrate is composed of a polymeric material capable of undergoing fusion bonding such as a fluoropolymeric based substrate. A circuit layer is comprised of a layer of suitable conductive material and a layer of suitable dielectric which has vias therethrough. Noble metal is applied at the bottom of the circuit layers and the top of vias wherever electrical connections are desired. Once stacked the circuits are subjected to lamination under heat and pressure to fuse all of the substrate and diffuse the noble metal layers together to form an integral multilayer circuit having solid conductive interconnects. It may also be necessary, depending on conductive metal and noble metal combinations, to include a barrier metallization (i.e., nickel) to prevent diffusion of the conductive metal into the noble metal. Barrier metals are not required if both circuit layers and vias are comprised of noble metal.

In a first embodiment of the present invention, the discrete circuit layers are each prepared by (1) forming traces and pads on a removable mandrel (e.g., copper) with a thin nickel barrier layer, these traces and pads comprising a layer of noble metal, a nickel barrier and a suitable conductive material (e.g., copper); (2) laminating a layer of dielectric to the circuit and mandrel; (3) forming an access opening at selected locations through the dielectric layer (using laser, plasma, ion etch or mechanical drilling techniques) to expose selected circuit locations; and (4) forming conductive posts in the access openings to the top of the access openings, the conductive post comprising a layer of a suitable conductive material, a layer of nickel deposited on the layer of conductive material and a layer of a noble metal (e.g., gold). Thereafter, a stack-up is made of a plurality of these discrete circuit layers so that the exposed diffusible conductive material contacts selected locations on an adjacent circuit. This stack-up is then subjected to heat and pressure to both fuse the several layers of dielectric substrate and diffuse the noble metal to provide a cohesive multilayer circuit board.

In a second embodiment of this invention, at least one discrete circuit board is made using any suitable technique to define a fusible dielectric substrate having a circuit pattern thereon. Next, a layer of fusible dielectric material having openings through selected locations is placed on the circuit board so that the selected locations on the circuit pattern are exposed. The circuit comprising a layer of a suitable conductive material, a layer of nickel deposited on the layer of conductive material and a layer of a noble metal (e.g., gold) deposited on the layer of nickel. Next, a second circuit board is stacked on the first board so that selected locations of the noble metal on the first circuit board align with and contact selected locations of the noble metal on the second circuit board. This stack-up is then subjected to heat and pressure to simultaneously fuse the layers of fusible dielectric and diffuse the noble metal to provide a cohesive multilayer circuit board.

All of the foregoing embodiments provide important features and advantages relative to prior art multilayer circuit fabrication techniques including lower manufacturing costs and increased circuit density.

The above discussed and other features and advantages of the present invention will be appreciated and understood by those skilled in the art from the following detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENT

The present invention relates generally to methods of interconnecting individual layers of a multichip module or multilayer circuit board using fused polymer composite bonding. All of the inner layers of the circuit boards are interconnected using a noble metal to achieve solid conductive interconnects. The noble metal may be introduced into the multilayer circuits using any number of techniques which will be described below. In addition, the present invention generally utilizes a fusible dielectric substrate which fuses with adjacent layers of dielectric substrate concurrently with the diffusion bonding of the noble metal.

Examples of suitable fusible dielectric substrates include fluoropolymer based substrate materials such as PTFE or the fluoropolymeric substrates describes in U.S. Pat. Nos. 4,335,180; 4,634,631; 4,647,508 or 4,849,284 (all of which are assigned to the assignee hereof and fully incorporated herein by reference). Examples of commercially available dielectric substrates suitable for the present invention include the materials sold under the tradenames RT/DUROID and RO-2800, both of which are available from Rogers Corporation, assignee of the present application.

Figure 1:
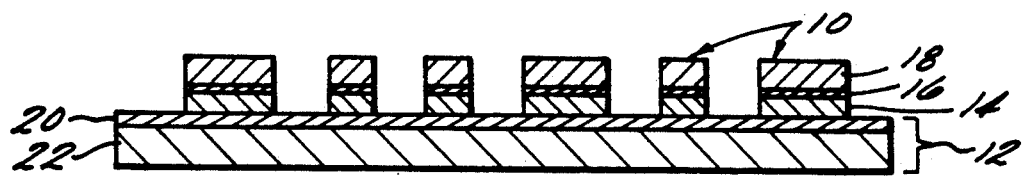
FIGS. 1–5 are sequential cross-sectional elevational views showing the fabrication of a discrete circuit board layer in accordance with the first embodiment of the present invention.
Figure 2:
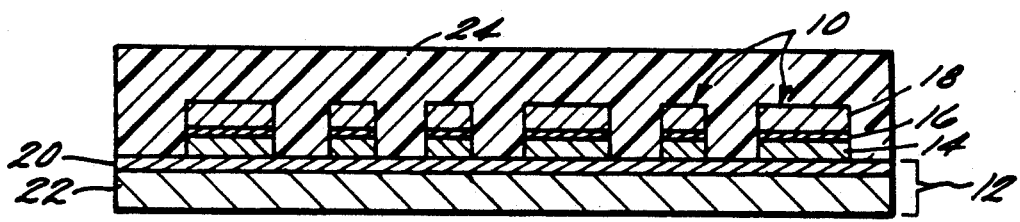
Figure 3:
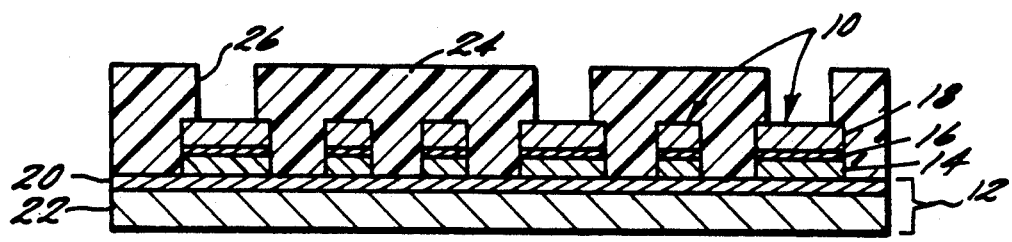
Figure 4:
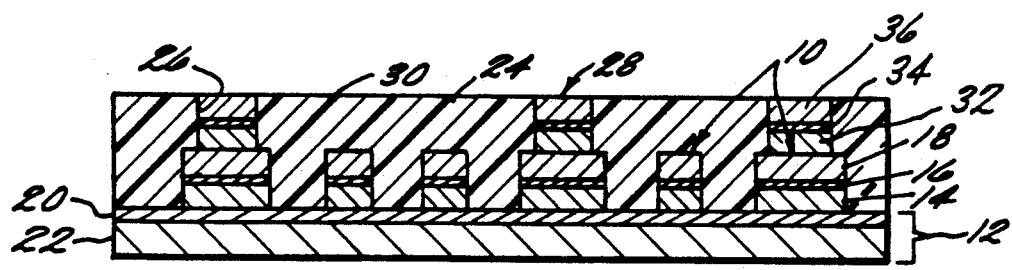
Figure 5:
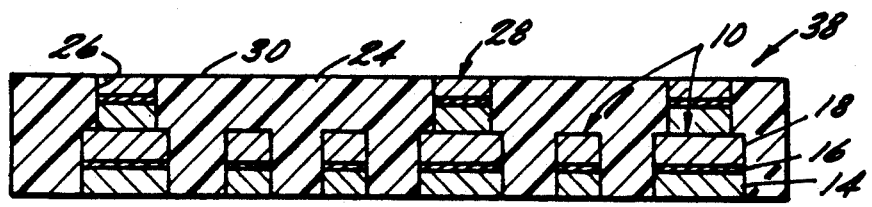

Turning now to FIGS. 1–7, a first embodiment of the present invention will now be described. In the first step shown in FIG. 1, a pattern 10 of circuit traces and pads is formed on a suitable mandrel 12. Circuit 10 is comprised of three layers; a first layer 14 comprises a noble metal (e.g., gold), a second layer 16 comprises nickel or equivalent which is deposited on layer 14 and a third layer 18 comprises a suitable conductive material such as copper or aluminum which is deposited on layer 16. Circuit 10 may be formed on mandrel 12 by any suitable method such as electroless plating, electroplating or vapor deposition. Mandrel 12 is preferably comprised of a layer 20 of nickel or equivalent deposited on a layer 22 of copper or other metal. Layer 16 of nickel prevents diffusion of the copper of layer 18 into the gold of layer 14. This diffusion would otherwise degrade the bondability of the gold. Next, as shown in FIG. 2 a layer of dielectric material 24 is laminated over circuit 10 and mandrel 12. Thereafter, access openings 26 are provided through dielectric layer 24 at selected locations to access the pads or traces 10 (see FIG. 3). Access openings 26 may be formed using any known means such as laser drilling, plasma etching, ion etching, mechanical drilling techniques, punching or using preformed posts to penetrate the dielectic. One particularly well suited technique is the laser etching methodology described in U.S. Pat. No. 4,915,981 which is assigned to the assignee hereof and incorporated herein by reference.

After the access openings 26 have been formed (see FIG. 4), conductive posts 28 are formed within access openings 26 so as to completely fill openings 26 to be level with a top surface 30 of dielectric layer 24 or extend slightly thereover. Conductive posts 28 are also comprised of three layers; a first layer 32 comprises a suitable conductive material such as copper or aluminum which is deposited on layer 18 of circuit 10, a second layer 34 comprises nickel or equivalent which is deposited on layer 32 and a third layer 36 comprises a noble metal (e.g., gold) which is deposited on layer 34. In the final step of forming a discrete circuit layer, the mandrel 12 is removed from the circuit and dielectric using any suitable removal methods such as known etching techniques. The final discrete circuit layer is thus shown at 38 in FIG. 5.

Figure 6:
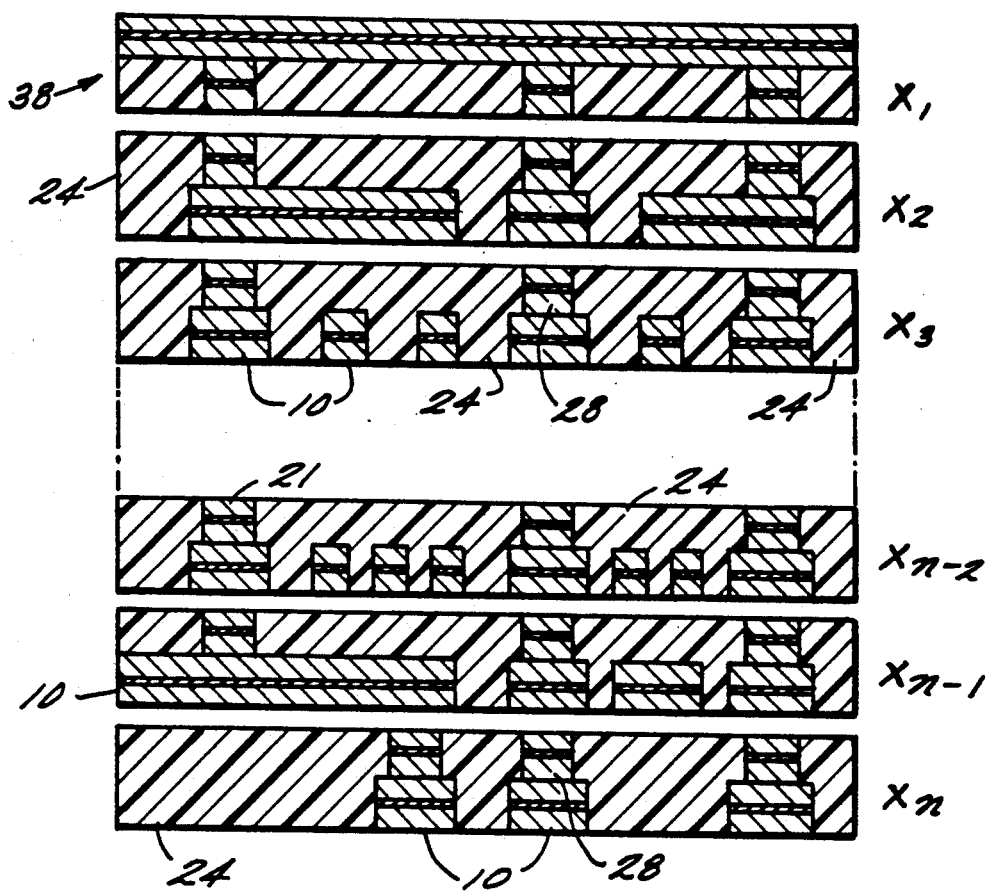
FIG. 6 is an exploded view depicting a stack-up of circuit boards of the type shown in FIG. 5.

Turning now to FIG. 6, a plurality of circuits 38 which have been fabricated in accordance with the techniques shown in FIGS. 1–5 are stacked one on top of the other in the manner shown. Of course, any number ($X_n$) of circuit substrates 38 may be stacked and registered with one another such that the selective areas of the noble metal layers from adjacent circuits 38 align.

After the discrete circuit boards have been stacked up as shown in FIG. 6, the stack up is subjected to lamination under sufficient heat and pressure so as to fuse the dielectric substrate 24 and diffuse the noble metal and thereby provide an integral and cohesive multilayer circuit board 40 (FIG. 7) having solid conductive interconnects.

Figure 7:
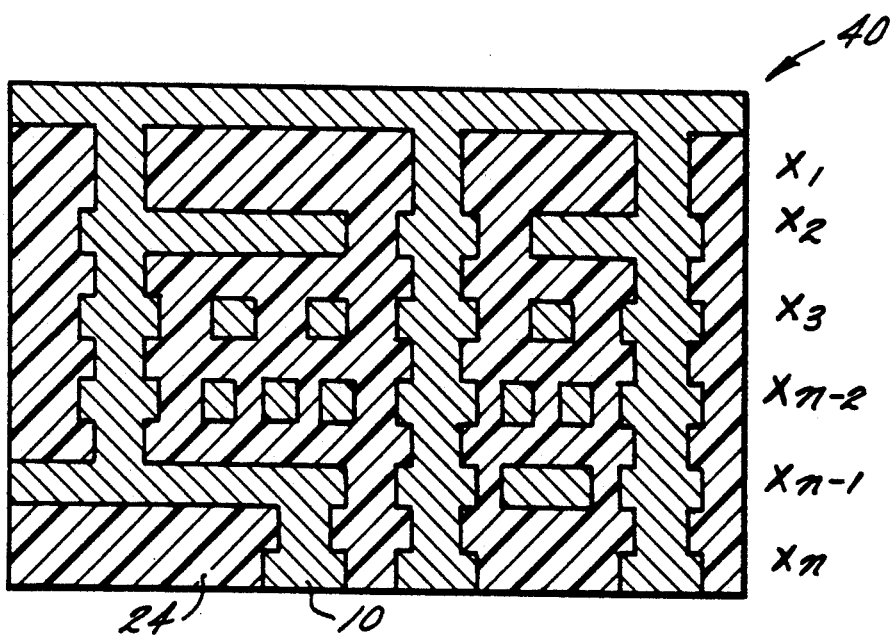
FIG. 7 is a cross-sectional elevation view of a final laminated multilayer circuit board made in accordance with the first embodiment of the present invention.
Figure 8:
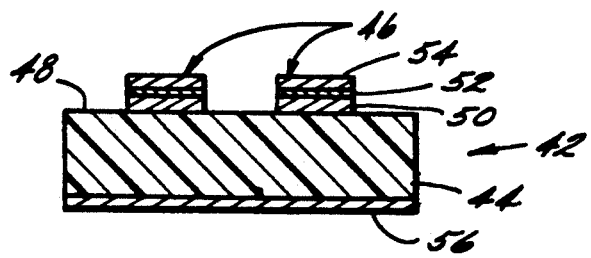
FIGS. 8–11 are cross-sectional elevation views depicting a sequential fabrication technique for making multilayer circuit boards in accordance with the second embodiment of the present invention.
Figure 9:
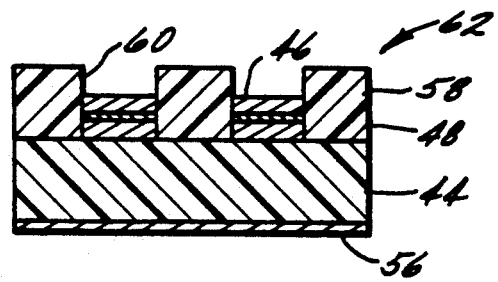

It will be appreciated that several alternative method steps may be utilized in conjunction with the first embodiment of this invention. For example, rather than the additive processing techniques for formation of the circuit traces shown in FIGS. 1–5, known subtractive imaging technology may be used to form circuits 10. Also, the diffusible interconnect material may be deposited by any known method such as screen printing or by using any other suitable selective placement technology. In addition, an intermediate bonding film having access openings selectively formed therein may be utilized between discrete circuit layers 38. This intermediate bonding film would include the diffusible conductive material therein so that upon lamination under heat and pressure, a final multilayer circuit such as shown in FIG. 7 would result. In still another alternative, the entire access opening 16 may be filled with the noble metal.

Turning now to FIGS. 8–11, a second embodiment in accordance with the present invention is shown. In this second embodiment, a circuit board shown generally at 42 is formed using any known processes. Circuit board 42 includes a dielectric substrate 44 comprised of a fusible polymeric material and a pattern of circuit traces and pads 46 on a top surface 48 of substrate 44. Circuit 46 is comprised of three layers; a first layer 50 comprises a suitable conductive material such as copper or aluminum which is deposited on substrate 44, a second layer 52 comprises nickel or equivalent which is deposited on layer 50 and a third layer 54 comprises a noble metal (e.g., gold) which is deposited on layer 52. An optional conductive layer 56 may be provided on the bottom surface of substrate 44 for shielding or other purposes. In the next step shown in FIG. 9, a layer of fusible dielectric material 58 is provided onto top surface 48 of dielectric layer 44. Layer 58 will include preselected registered openings 60 therethrough which correspond to preselected locations on circuit traces 46 resulting in the assembly identified at 62. Alternatively, layer 58 may be positioned over circuit 42 with openings 60 formed "in situ" using laser etching or other techniques.

Figure 10:
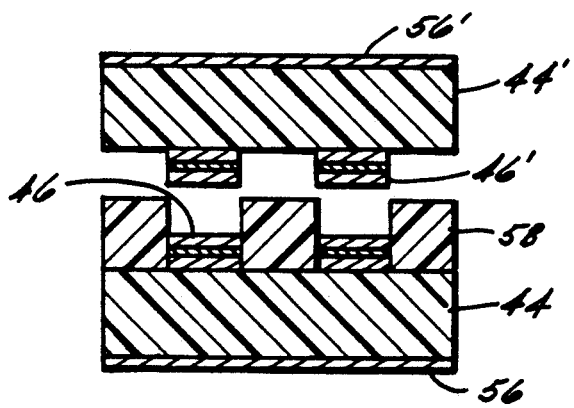
Figure 11:
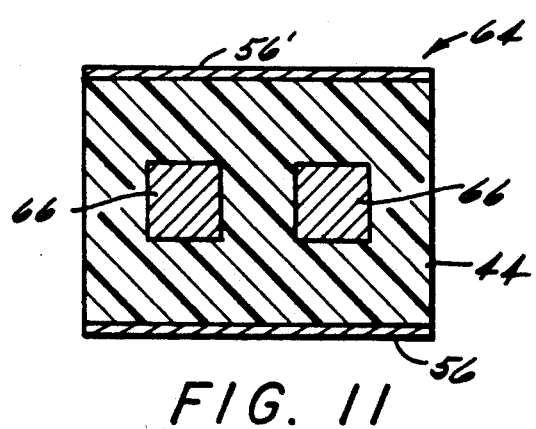

Next, as shown in FIG. 10, a second circuit 42' is disposed over circuit assembly 62 such that layer 54' of gold of circuits 46' are aligned with layer 54 of gold of circuit 46. The stack-up in FIG. 10 is then subjected to heat and pressure lamination as described above resulting in the diffusion of gold layer 54 and 54' of circuits 46 and 46', and the fusion of the dielectric layers 44, 44' and 58 to provide a cohesive multilayer circuit board 64 having solid conductive interconnects 66 (see FIG. 11). It will be appreciated that as in the first embodiment, any number of circuits 66 may be stacked to form any desired multilayer circuit configuration.

For both the first and second embodiments of this invention, lamination temperatures and pressures will vary with the composition of fusible dielectric and the noble metal.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of making a multilayer circuit comprising the steps of:

providing at least two circuit boards wherein said first circuit board comprises a first substrate of fluoropolymeric dielectric material and a first conductive circuit formed thereon and said second circuit board comprises a second substrate of fluoropolymeric dielectric material and a second conductive circuit formed thereon and wherein each of said first and second conductive circuits include a layer of a diffusible conductive material on at least one selected location thereof;

stacking said at least tow circuit boards one on top of the other so that said at least one selected location of said diffusible conductive material on said first circuit aligns with said at least one selected location of said diffusible conductive material on said second circuit; and laminating said stacked circuit boards under heat and pressure effective to both fuse said fluoropolymeric dielectric material and diffuse said diffusible conductive material so as to form a cohesive multilayer circuit having a solid conductive interconnect between said first and second circuits, said solid conductive interconnect being defined by said diffusible conductive material.

2. The method of claim 1 wherein at least one of said two circuit boards are formed using the steps of:

forming a circuit pattern;

forming a fluoropolymeric dielectric material substrate having opposed first and second surfaces, said circuit pattern being located on said first surface of said substrate;

forming at least one access opening through said second surface of said substrate to expose a selected location on said circuit pattern; and filling said access opening with conductive material wherein at least an upper portion of said filled access opening comprises said diffusible conductive material.

3. The method of claim 2 wherein:

a portion of said access opening comprises non-diffusible conductive material.

4. The method of claim 2 including the step of:

forming said circuit pattern on a mandrel prior to forming said dielectric substrate on said circuit pattern.

5. The method of claim 4 including the step of:

removing the mandrel subsequent to filling the access opening with conductive material.

6. The method of claim 2 wherein:

said access opening is formed by at least one of the opening formation techniques selected from the group consisting of laser drilling, mechanical drilling, plasma etching, ion etching, punching, and using preformed posts to penetrate dielectric.

7. The method of claim 1 wherein:

said fluoropolymeric material comprises a polytetrafluoroethylene based material.

8. The method of claim 1 wherein said first and second conductive circuits comprise a noble metal.

9. The method of claim 1 wherein:

said diffusible conductive material comprises a noble metal.

10. The method of claim 9 wherein:

said noble metal comprises gold.

11. The method of claim 9 wherein each of said first and second circuits comprise:

a layer of copper;

a layer of nickel deposited on said layer of copper; and said layer of noble metal deposited on said layer of nickel.

12. The method of claim 9 wherein each of said first and second circuits comprise:

a layer of a conductive material; and said layer of noble metal deposited on said layer of conductive material.

13. The method of claim 12 wherein said layer of conductive material comprises copper or aluminum.

* * * * *